(12) United States Patent
Camuffo et al.

(10) Patent No.: US 9,407,227 B2
(45) Date of Patent: Aug. 2, 2016

(54) REGULATION OF AN AMPLIFICATION APPARATUS

(75) Inventors: Andrea Camuffo, Munich (DE); Andreas Langer, Unterschleissheim-Lohhof (DE)

(73) Assignee: Intel Deutschland GmbH, Neubiberg (DE)

(*) Notice: Subject to any disclaimer, the term of this patent is extended or adjusted under 35 U.S.C. 154(b) by 2051 days.

(21) Appl. No.: 11/595,279

(22) Filed: Nov. 9, 2006

(65) Prior Publication Data

US 2008/0113635 A1 May 15, 2008

(51) Int. Cl.
*H01Q 11/12* (2006.01)
*H03G 3/30* (2006.01)

(52) U.S. Cl.
CPC .................................. *H03G 3/3047* (2013.01)

(58) Field of Classification Search
CPC ... H03G 3/3047; H03G 3/3042; H03F 1/0261
USPC ............... 455/127.1, 253.2, 251.1, 246.1
See application file for complete search history.

(56) References Cited

U.S. PATENT DOCUMENTS

| 6,628,165 B1* | 9/2003 | Henderson et al. ............. 330/85 |
| 6,701,138 B2* | 3/2004 | Epperson et al. .......... 455/127.3 |
| 6,718,164 B1* | 4/2004 | Korneluk et al. .......... 455/115.1 |
| 7,010,284 B2* | 3/2006 | Liu et al. .................... 455/253.2 |
| 2003/0114124 A1* | 6/2003 | Higuchi ........................ 455/126 |
| 2004/0127173 A1* | 7/2004 | Leizerovich ......... H04B 1/0475 455/93 |
| 2004/0137852 A1* | 7/2004 | Shi et al. ......................... 455/73 |
| 2006/0240788 A1* | 10/2006 | Iwaniya et al. ............ 455/127.1 |

* cited by examiner

*Primary Examiner* — Wesley Kim
*Assistant Examiner* — Richard Chan
(74) *Attorney, Agent, or Firm* — Schwegman Lundberg & Woessner, P.A.

(57) ABSTRACT

An amplifier module comprises an amplifier having an output, a coupler coupled to the output to receive a first signal provided at the output and a power detector to provide a power signal from the first signal. It further comprises an input to receive a second signal. A switch is provided that is disposed to provide the power signal or the second signal to a signal output in dependence of a control signal.

12 Claims, 2 Drawing Sheets

# REGULATION OF AN AMPLIFICATION APPARATUS

BACKGROUND

Embodiments of the present invention relate to an amplifier module, an amplification apparatus, to a transmitter having an amplifier stage, and a method for regulation of an amplification apparatus.

In any electronic communication system a transmitter includes an output amplifier, i.e. an amplification apparatus that boosts the power of a transmission signal to a level sufficient to allow for a reception of the transmission signal by a receiver. Particularly in a wireless communication system, such as defined by the GSM (Global System for Mobile Communication) standard or defined by UMTS (Universal Mobile Telecommunication Standard) or W-CDMA (Wideband Code Division Multiple Access), the power level of a mobile unit has to be adjusted according to rules given by a base station. A mobile terminal in a wireless communication system has to cope with changing environmental conditions. E.g. the operating temperature of the environment might be changing in a wide range. The 3GPP standard defines a range for the operating temperature between −10° C. up to 55° C. Real conditions can even be worse. Supply voltages in a mobile terminal may also vary, due to limited energy resources provided by a battery or accumulator cell. The supply voltage may be determined by the battery discharge characteristic and the voltage may thus drop during a transmit operation.

In addition the output amplifier may be subject to strict constraints on linearity and efficiency. If the transmitter is using an amplitude modulation such as 8-PSK modulation used in GSM EDGE (Enhanced Data GSM Environment), the output amplifier has to be arranged so that the output signal is linear in relation to the input signal to avoid a distortion of the output signal. Linearity and efficiency are also important in other modulation, such as GMSK (Gaussian Minimum Shift Keying).

The efficiency of the output amplifier is defined by the ratio of an outgoing power level at an output of the output amplifier to the power input into the output amplifier. The lower that ratio the more efficient the input power is brought onto the outgoing signal. This is advantageous if the transmitter is part of a mobile terminal having only limited power resources. It is known to perform power regulation in the mobile terminal. A known concept of controlling the power level is a so-called closed power loop, measuring the power level at an output of the output amplifier and comparing it to a desired power level to regulate accordingly the power level of an outgoing signal.

BRIEF DESCRIPTION OF THE DRAWINGS

Embodiments of the invention will be explained in detail in the following text with reference to the accompanying drawings, in which.

DETAILED DESCRIPTION

Figure 1:
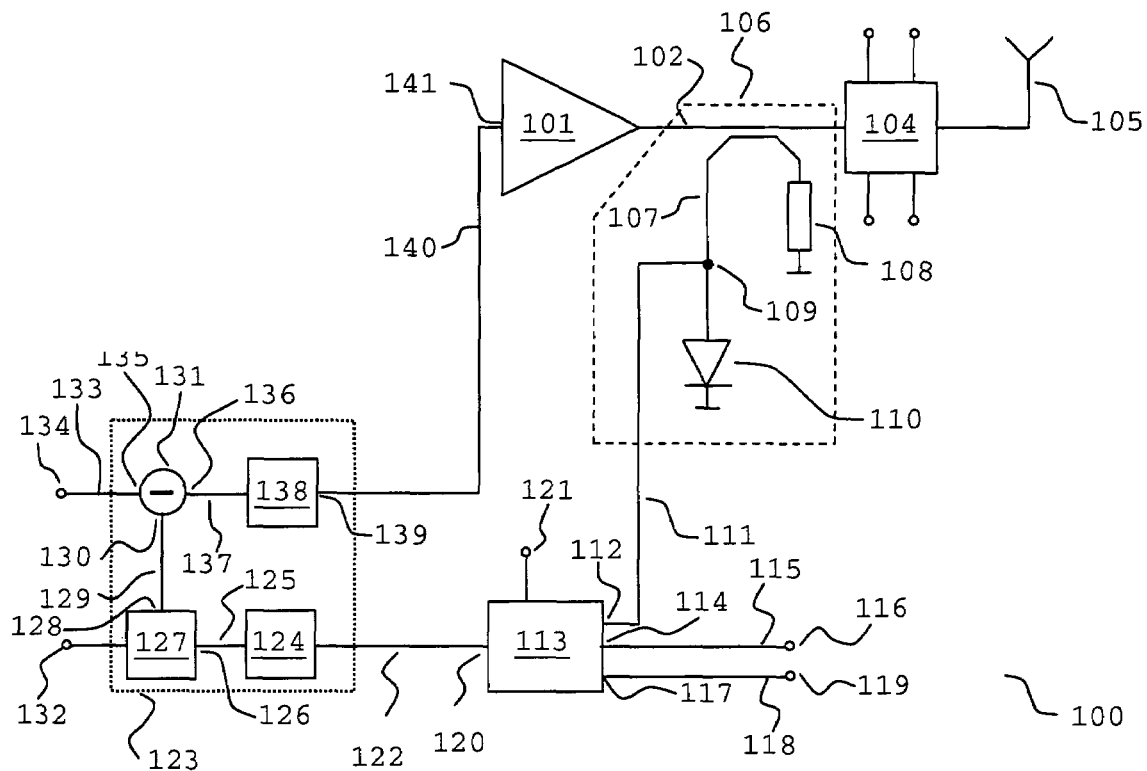
FIG. 1 illustrates an embodiment of an amplification apparatus.

FIG. 1 illustrates an embodiment of an amplification apparatus. The amplification apparatus 100 has an amplifier stage 101 that receives a transmission signal to be transmitted. The transmission signal is amplified by the amplifier stage 101 according to gain set by a gain setting signal. The amplified transmission signal is provided at an output line 102. The output line 102 is connected via a power switch 104 to an antenna 105. The power switch 104 serves to couple the amplifier stage 101 to the antenna 105 during a transmit operation of the amplification apparatus 100. During a receive operation the power switch 104 couples the antenna 105 to a receive path of a transmitter in which the amplification apparatus might be arranged. The receive path is not shown in FIG. 1, yet multiple implementations for different kinds of a receive paths are known to a person skilled in the art.

The output line 102 is further coupled to a power detector 106 (shown by broken lines). The power detector 106 comprises a feedback line 107. A portion of the feedback line 107 is routed in parallel to the output line 102. Consequently, the feedback line 107 has a parallel section. One first end of the parallel section is directed towards the antenna 105 and is provided with a terminating resistance 108 of a given value, e.g. 50 ohms. Yet in other embodiments, the first end may be open-ended with no terminating resistance provided. The second end of the parallel section is connected to a node 109 via the feedback line 107. The detector 106 thus receives a first signal, which corresponds to an attenuated version of the amplified transmission signal. The node 109 is connected to a ground terminal via a diode 110. Consequently, the detector 106 provides a detector voltage at the node 109 that represents the power emitted by the amplifier stage 101.

A first line 111 connects the node 109 to a first input 112 of a switch module 113. The switch module 113 has a second input 114. A second line 115 connects the second input 114 to a first terminal input 116. The switch module 113 has a third input 117. A third line 118 connects the third input 117 to a second terminal input 119. The switch module 113 further has a signal output 120 and a control input 121. A signal line 122 connects the signal output 120 to an Automatic Power Control unit or APC unit 123 (represented in dotted lines). The APC unit 123 comprises an analog-to-digital converter 124 that is connected to the signal output 120 via the signal line 122. The analog-to-digital converter 124 produces a digital signal corresponding to an analog signal provided at the signal output 120. A digital signal line 125 connects the analog-to-digital converter 121 to an input 126 of a switch 127. A first output 128 of the switch 127 connects via a line 129 to a first input 130 of a subtractor 131. The switch 127 has a second output 132.

The switch module 113 is controlled by a control signal fed into the control input 121. The same control signal or derivative of that signal is fed into the switch 127. In a first state of the control signal, the switch module 113 couples the first input to the signal output 120. Thus, the power detector voltage is provided to the analog-to-digital converter 124. The analog-to-digital converter 124 provides a digital power detector signal. The switch 127 connects the analog-to-digital converter 124 to the first output 128. The digital power detector signal is therefore provided at the first output 128. No signal is provided at the second output 132. In a second state of the control signal, the switch module 113 couples the first terminal input 116 to the signal output 120. A first voltage provided at the first terminal input 116 is fed into the analog-to-digital converter 124. The analog-to-digital converter 124 provides a first digital signal calculated from the first voltage. The switch 127 connects the analog-to-digital converter 124 to the second output 132. The first digital signal is therefore provided at the second output 132. No signal is provided at the first output 128. In a third state of the control signal, the switch module 113 couples the second terminal input 119 to the signal output 120. A second voltage provided at the second terminal input 119 is fed into the analog-to-digital converter 124. The analog-to-digital converter 124 provides a second digital signal calculated from the second voltage. The switch 127 connects the analog-to-digital converter 124 to the second output 132. The second digital signal is therefore provided at the second output 132. No signal is provided at the first output 128.

The APC unit 123 further comprises a target value line 133 that connects a target value terminal 134 to a second input 135 of the subtractor 131. A target value signal may be feed to target value terminal 134, that target value signal represents a power level to be reached by the amplifier stage 101. The subtractor 131 subtracts a signal provided at the first input 130 from the target value signal and provides a corrected target signal at a subtractor output 136. A connection line 137 connects the subtractor output 136 to a controller unit 138. The controller unit 138 has a control output 139. A control line 140 connects the control output 139 to a power control input 141 of the amplifier stage 101.

The amplification apparatus 100 thus shows a feedback loop for regulating the output power of the amplifier stage 101. During or at the beginning of a transmit operation mode the switching unit 113 connects the power detector 106 to the analog-to-digital converter 124. The digital power detector signal provided by the analog-to-digital converter 124 is transferred to the subtractor 131. The subtractor 131 provides a signal that represents the difference between a target value of the output power of the amplifier stage 101 and the real output power measured by the power detector 106. In accordance with that difference the controller unit regulates the gain of the amplifier stage 101 so that the target value and the real output value will be identical. The target value is set be the target value signal, which might be provided by an external unit such as a baseband unit or any other digital signal processing unit. It is also possible, that the amplification apparatus and/or the transmitter and the external unit are integrated into a single chip or device. Any split of that system into different devices and/or semiconductor chips is possible.

If the amplification apparatus 100 is working in a receive mode, the switch module 113 connects at least one of the first input terminal 116 and the second input terminal 119 to the analog-to-digital converter 124. The switch 127 connects the analog-to-digital converter 127 to the second output 132. The voltage provided and one of the first input terminal 116 and the second input terminal 119 may be a voltage being derived from a supply or battery voltage provided to the amplification apparatus 100. It might as well be a voltage derived from a voltage measured at a NTC or PTC cell arranged in the amplification apparatus 100. Such a NTC or PTC cell might sample a temperature of the amplifier stage 101, so that the voltage would represent that temperature. In consequence the digital signal provided at the second output 132 would represent a measurement of one of the supply voltage and the temperature of the amplifier stage 101. That information may be provided to the external unit setting the target value of the output power. The external unit may be disposed to set the target value for the next transmit operation during the receive operation. It may be disposed to set the target value according to a digital signal provided at the end of a receive operation.

In one embodiment, the analog-to-digital converter 124 samples the battery voltage during time intervals when power detection is not needed. Depending on the measurement, the external unit changes the target value for the next transmit burst. By way of example, a simple algorithm may be as follows. When the battery voltage drops below a threshold, that might be adjustable or programmable, the external unit reduces the target value of the output power by a fixed and pre-determined step. This may result in maintaining a linearity performance of the amplifier stage 101 in a transmit mode using an 8-PSK modulation. Another example would be a more advanced algorithm that reduces output power as a linear function of the battery voltage by possibly referring to a voltage threshold and a power reduction slope.

In one embodiment, the amplifier stage 101 comprises a plurality of single amplifier stages. In an embodiment, the power regulation is performed at a final output stage arranged in the amplifier stage 101. According to one embodiment, the amplifier stage 101 comprises a programmable gain amplifier (PGC amplifier). In one embodiment, the power regulation is performed at the PGC amplifier. In an embodiment, preferably used in an EDGE or amplitude modulated system, the amplifier stage 101 is input power regulated. In one embodiment, the amplifier stage 101 comprises a power amplifier.

In one embodiment the controller unit 123 is switched of during a receive operation of a transmitter in which the amplification apparatus is arranged.

Figure 2:
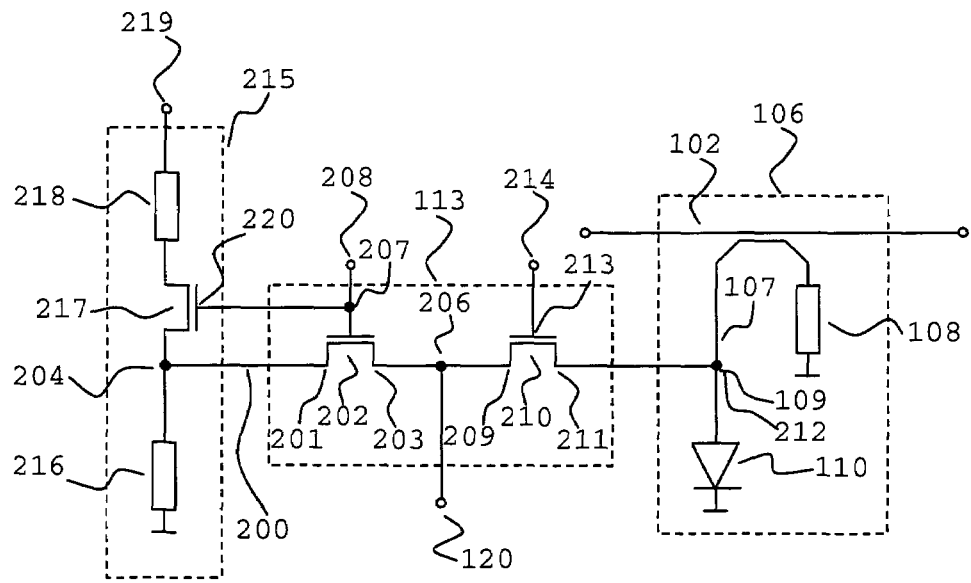
FIG. 2 illustrates an example of a switching module arranged in one or several embodiments of the amplification apparatus.

FIG. 2 illustrates an example of a switching module 113 (shown in broken lines) arranged in one or several embodiments of an amplification apparatus. Each element identical to one shown in FIG. 1 has an identical reference number. This way of reference is done to simplify the understanding of the shown example and is not to be understood to interpret or limit the scope or meanings of the claims. The switching module 113 has a first input line 201 to receive a first voltage representing a supply power of the amplification apparatus. The first input line 200 is connected to a first terminal 201 of a first transistor 202 and to a first node 204. A second terminal 203 is connected to a second node 206. The second node 206 is connected to a signal output 120. A source-drain path of the first transistor 202 connects the first terminal 201 and the second terminal 203. A first gate terminal 207 of the first transistor 203 is connected to a first signal input 208. The second node 206 is coupled to a third terminal 209 of a second transistor 210. A fourth terminal 211 of the second transistor is connected to a third node 212. A source-drain path of the second transistor 210 connects the third terminal 209 and the fourth terminal 211. A second gate terminal 213 of the second transistor 210 is connected to a second signal input 214.

The first node 204 is arranged in a supply voltage detector 215 (shown in broken lines). The first node 204 is connected via a first resistor 216 to a ground terminal. Furthermore, the first node 204 is connected via a source-drain-path of a third transistor 217 and a second resistor 218 to a battery voltage input 219. A third gate terminal 220 of the third transistor 217 is connected to the first signal input 208. The supply voltage detector 215 thus represents a voltage divider if the source-drain-path of the third transistor 217 is open. A first voltage provided at the first node 204 is scaled down by the voltage divider. In accordance, a battery voltage provided at the battery voltage input 219 and the relation of the resistance of the first resistor 216 to the resistance of the second resistor 218 determines the first voltage. This relation is chosen according to the implementation of the amplification apparatus and e.g. would be dependent on the resolution and operational range of the analog-to-digital converter 124 shown in FIG. 1. By way of example, the first resistor 216 has a value of 10 kΩ while the second resistor has a value of 100 kΩ to scale down the battery voltage so to allow for a processing in the analog-to-digital converter 124.

The third transistor 217 is advantageously closed if the supply voltage detector 215 is not used, so that a battery current through the first resistor 216, the third transistor 217 and the second resistor 218 is reduced.

The third node 212 is arranged in a power detector 106 and would correspond to the node 109 shown in FIG. 1. The power detector 106 is identical to the power detector 106 shown in FIG. 1 and shows identical elements. Yet is possible to have different implementation of the power detector 106, as already described above.

The three transistors 202, 210, and 217 serve to connect either the supply voltage detector 215 or the power detector 106 to the signal output 120. When the first transistor 202 is "turned on", i.e. it receives a signal at the first gate terminal 207 so to open the source-drain path, the supply voltage signal provided at the first node 204 is passed on to the signal output 120. It has to be noted, that at the same time, the third transistor 217 will be turned on as well. Meanwhile the second transistor 210 is turned off, i.e., it receives a signal at the second gate terminal 213 that will be low enough to block the source-drain path of the second transistor 210. This is achieved by applying according voltages to the first signal input 208, e.g. by a high level voltage or a logic "1" bit, and to the second signal input 214, e.g. by a low level voltage or a logic "0" bit.

When the first transistor 202 and the third transistor 217 are turned off, and the first transistor 210 is turned on, the power detector voltage is passed on to the signal output 120. By way of example this could be achieved by applying voltages to the first signal input 108, e.g. by a low level voltage or a logic "0" bit, and to the second signal input 214, e.g. by a high level voltage or a logic "1" bit. In general, if a digital control signal is used, a digital signal provided at the first signal input 208 is a logic complementary to a digital signal provided at the second signal input 213.

Figure 3:
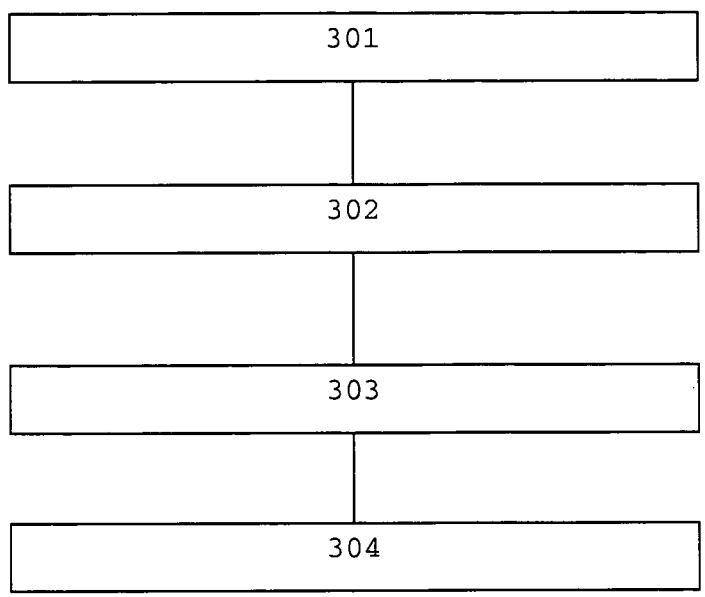
FIG. 3 illustrates an embodiment of a method for power adjustment of an amplifier in a transmitter.

FIG. 3 illustrates an embodiment of a method for power adjustment of an amplifier in a transmitter. The method is applicable in one of the embodiments of FIG. 1 or 2 but might also be used in apparatus arranged accordingly. In a first step 301 a first signal indicating an output power of the amplifier is provided. In a second step 302 a second signal indicating a supply voltage provided to the amplifier is provided. In other embodiments, step 301 and step 302 are performed simultaneously or the sequence of the steps is interchanged. In a third step 303 one of the first signal or the second signal is selected as power control signal in dependence to a operation state of the transmitter. In a fourth step 304 the output power of the amplifier is controlled in dependence of the power control signal.

In one embodiment the first signal is provided as power control signal during a transmit operation state of the transmitter. In one embodiment the second signal is provided as power control signal during a transmit operation state of the transmitter. In one embodiment the second signal is provided as power control signal during a receive operation state of the transmitter. This selection is performed during the third step 303.

The method may be realized in many different embodiments. As way of example there are at least two options:

Read the battery voltage or the temperature indicating voltage during a transmit operation or transmit burst; or
Read the battery voltage or the temperature indicating voltage during a receive operation or receive burst.

The first option is applicable for power control which operates in open loop power control mode during a transmit operation. E.g. this is the case in an amplitude modulated system such as 8-PSK. It might be advantageous to wait to ramp up before measuring the battery voltage during the transmit operation. In one embodiment, a capacitor is arranged in the amplification apparatus. It is thus possible to set a pre-defined time interval by monitoring a discharge of the capacitor. When the amplification apparatus is switched on, the capacitor is charged by the switching-on signal. Meanwhile the switch module connects the power detector voltage to the analog-to-digital converter. Then, the capacitor is discharged having a characteristic time constant defined by its capacitance. If a voltage at the capacitor reaches a certain value or drops below that value, the switch module connects the supply voltage signal to the analog-to-digital converter. This procedure does not need to be very time accurate. E.g., in a GSM system a total burst takes about 542 µs while a measurement of the battery voltage might be done in about 1-10 µs. Thus in one embodiment the measurement of the battery voltage could be done at the end of the burst, which significantly reduces the need for a accurate timing. Consequently, the capacitor does not require a high degree of accuracy in its capacitance nor is a process needed to fabricate that capacitor having a degree of high accuracy.

In one embodiment, the battery voltage is measured during a receive operation. This method is advantageous for an amplification apparatus having the switch module integrated in a single chip with the amplifier stage. This single chip receives an external signal indicating a transmit or receive state. The external signal is used to control the switch module. In this method, the measured supply voltage signal may be stored in a register so that the content of the register is used to determine a target value or a necessary power reduction. The register may be arranged within the amplification apparatus or an external unit. This might be advantageous if the first transmit operation is performed after a receive operation. Thus a battery information is available before the first transmit operation and linearity may be already met in the first transmit operation.

The abstract of the disclosure is provided to comply with 37 C.F.R §1.72(b), requiring an abstract that will allow the reader to quickly ascertain the nature of the technical disclosure. It is submitted with the understanding that it will not be used to interpret or limit the scope or meanings of the claims. In addition, in the foregoing Detailed Description, it can be seen that various features are grouped together in a single embodiment for the purpose of streamlining the disclosure. This method of disclosure in not to be interpreted as reflecting an intention that the claimed embodiments require more features than expressly recited in each claim. Rather, as the following claims reflect, inventive subject matter lies in less than all features of a single disclosed embodiment. Thus the following claims are hereby incorporated into the Detailed Description, with each claim standing on its own as a separate embodiment.

What is claimed is:
1. An amplifier system comprising:
switching circuitry to configure the amplifier system for operation in either transmit mode or receive mode;
power control circuitry to control an output power level of RF output signals transmitted by a power amplifier when the system is operating in the transmit mode based on a target value; and
circuitry to update the target value when the system is operating in the receive mode based on an indicator of a temperate of the power amplifier,
wherein the switching circuitry is configured to allow the target value to be updated in the receive mode and allow the updated target value to be used in a subsequent transmission in the transmit mode.

2. The amplifier system of claim 1 wherein the indicator used to update the target value is an indicator of both a supply voltage level and the temperate of the amplifier.

3. The amplifier system of claim 1 wherein the indicator used to update the target value is an indicator of either a supply voltage level or the temperate of the amplifier.

4. An amplifier system comprising:
power control circuitry to control an output power level of an amplifier when the system is operating in transmit mode based on a target value; and
circuitry to update the target value when the system is operating in receive mode based on an indicator of at least one of a supply voltage level and a temperate of the amplifier; and
switching circuitry and configured to allow the indicator to be used to: control the output power level of the amplifier based on the target value during the transmit mode, and update the target value during the receive mode,
wherein the updated target value is used in a subsequent transmission in transmit mode.

5. The amplifier system of claim 4 further comprising power detection circuitry to generate an output power level signal corresponding to the output power level of the amplifier,
wherein during the transmit mode within a transmit burst, the switching circuitry is initially configured to provide the output power level signal for use to set the output power level of the amplifier during an initial portion of the burst and subsequently configured to provide the indicator to be used to set the output power level of the amplifier during a subsequent portion of the burst.

6. The amplifier system of claim 5 wherein the switching circuitry is configured to switch between providing the output power level signal and the indicator based on a predefined time interval during the transmit burst.

7. The amplifier system of claim 4 wherein the switching circuitry is further configured to allow either an indicator of the supply voltage level or an indicator of temperature to be used to update the target value during the receive mode based on a control signal.

8. The amplifier system of claim 4 wherein the circuitry to update the target value is configured to reduce the target value when a lower supply voltage is indicated to help maintain linear operation of the amplifier.

9. The amplifier system of claim 4 wherein the circuitry to update the target value is configured to reduce the target value when a higher temperature is indicated to help maintain linear operation of the amplifier.

10. The amplifier system of claim 4 further comprising:
a register to store the at least one of an indicator of a supply voltage and an indicator of a temperate of the amplifier during receive mode,
wherein the indicator stored in the register is for use in updating the target value.

11. An amplifier system comprising:
switching circuitry to configure the amplifier system for operation in either transmit mode or receive mode;
power control circuitry to control an output power level of RF output signals transmitted by a power amplifier when the system is operating in the transmit mode based on a target value; and
circuitry to update the target value when the system is operating in the receive mode based on an indicator of a temperate of the power amplifier,
wherein the switching circuitry is configured to allow the target value to be updated in the receive mode and allow the updated target value is used in a subsequent transmission in the transmit mode,
wherein the circuitry to update the target value is configured to reduce the target value when a higher temperature is indicated to help maintain linear operation of the amplifier.

12. A method for controlling an output power level of an amplifier system configured for operation in either transmit mode or receive mode, the method comprising:
switching the amplifier system between the transmit mode and the receive mode;
updating a target value when the system is operating in the receive mode based on an indicator of a temperate of a power amplifier;
controlling the output power level of RF output signals transmitted by the power amplifier when the system is operating in the transmit mode based on the updated target value; and
reducing the target value when a higher temperature is indicated to help maintain linear operation of the amplifier,
wherein switching between the transmit mode and the receive mode allows the target value to be updated during the receive mode and allows the updated target value to be used in a subsequent transmission during the transmit mode.

* * * * *